United States Patent
Lee et al.

(10) Patent No.: US 9,704,932 B2
(45) Date of Patent: Jul. 11, 2017

(54) FOLDABLE DISPLAY

(71) Applicant: Samsung Display Co., Ltd., Yongin, Gyeonggi-Do (KR)

(72) Inventors: Sang-Jo Lee, Yongin (KR); Cheol-Su Kim, Yongin (KR); Won-Suk Choi, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 324 days.

(21) Appl. No.: 14/297,424

(22) Filed: Jun. 5, 2014

(65) Prior Publication Data

US 2015/0230349 A1 Aug. 13, 2015

(30) Foreign Application Priority Data

Feb. 10, 2014 (KR) ........................ 10-2014-0014967

(51) Int. Cl.

| H05K 5/02 | (2006.01) |
|---|---|
| H05K 5/00 | (2006.01) |
| H05K 1/02 | (2006.01) |
| H01L 27/32 | (2006.01) |
| G06F 1/16 | (2006.01) |
| H01L 51/00 | (2006.01) |
| H04M 1/02 | (2006.01) |
| G09F 9/30 | (2006.01) |

(52) U.S. Cl.
CPC ........ *H01L 27/3244* (2013.01); *G06F 1/1652* (2013.01); *H01L 51/0097* (2013.01); *H04M 1/0268* (2013.01); *G09F 9/301* (2013.01); *H01L 2251/5338* (2013.01); *H04M 1/0214* (2013.01); *H04M 1/0235* (2013.01); *Y02E 10/549* (2013.01)

(58) Field of Classification Search
CPC .......... H05K 5/02; H05K 5/0217; H05K 1/02; H05K 5/00; H05K 5/0086; H05K 1/028
USPC ...................................... 361/679.21
See application file for complete search history.

(56) References Cited

U.S. PATENT DOCUMENTS

| 8,493,726 B2 * | 7/2013 | Visser .................. G06F 1/1601 361/679.05 |
| 2006/0038745 A1 * | 2/2006 | Naksen ................ G06F 1/1624 345/30 |
| 2006/0146488 A1 | 7/2006 | Kimmel |
| 2009/0027841 A1 * | 1/2009 | Shih .................... H04M 1/0274 361/679.09 |

(Continued)

FOREIGN PATENT DOCUMENTS

| KR | 10-2008-0035709 A | 4/2008 |
| KR | 20080035709 A * | 4/2008 |

(Continued)

*Primary Examiner* — Eric Thomas
*Assistant Examiner* — Michael P McFadden
(74) *Attorney, Agent, or Firm* — Ladas & Parry LLP

(57) ABSTRACT

A foldable display is disclosed. In one aspect, the foldable display includes a flexible display panel having first and second ends opposing each other, a first plate connected to the first end of the flexible display panel, and a second plate facing the first plate. The foldable display further includes a third plate configured to slide in and out of the second plate, wherein the third plate is connected to the second end of the flexible display panel. The foldable display also includes a first rotary plate hinged to at least one of the first and second plates.

21 Claims, 4 Drawing Sheets

(56) References Cited

U.S. PATENT DOCUMENTS

| | | | |
|---|---|---|---|
| 2010/0201604 A1 | 8/2010 | Kee et al. | |
| 2011/0227822 A1* | 9/2011 | Shai | G06F 1/1615 345/156 |
| 2012/0314399 A1* | 12/2012 | Bohn | G06F 1/1616 362/97.1 |
| 2013/0120912 A1* | 5/2013 | Ladouceur | H04M 1/0268 361/679.01 |

FOREIGN PATENT DOCUMENTS

| | | |
|---|---|---|
| KR | 10-2010-0027502 A | 3/2010 |
| KR | 10-2010-0092222 A | 8/2010 |

* cited by examiner

FOLDABLE DISPLAY

CROSS-REFERENCE TO RELATED APPLICATIONS

This application claims the benefit of Korean Patent Application No. 10-2014-0014967, filed on Feb. 10, 2014, in the Korean Intellectual Property Office, the disclosure of which is incorporated herein in its entirety by reference.

BACKGROUND

Field

The described technology generally relates to a foldable display.

Description of the Related Technology

Flat panel displays, such as organic light-emitting diode (OLED) displays, can be flexible, and thus they can have a foldable structure to improve the mobility of the displays.

SUMMARY OF CERTAIN INVENTIVE ASPECTS

One inventive aspect is a foldable display that can be folded and unfolded.

Another aspect is a foldable display including a flexible display panel that is foldable; a first plate to which one end portion of the flexible display panel is connected; a second plate arranged to face the first plate; a slide plate slidably connected to the second plate and to which another end portion of the flexible display panel is connected; and a rotary plate hinged to at least one of the first plate and the second plate.

When the foldable display is folded, the one end portion of the flexible display panel may be seated in a bending state in a seating space between the first plate and the second plate, and the other end portion of the flexible display panel may be provided on the opposite side of the seating space of the second plate.

The foldable display may be folded, the flexible display panel may be S-shape foldable.

When the foldable display is unfolded, the slide plate may slide in a direction far away from the second plate, and the rotary plate may rotate in a direction parallel to the first plate and the second plate.

A part of the flexible display panel that is seated in the seating space when the foldable display is folded may be removed from the opposite side of the seating space of the second plate and the slide plate when the foldable display is unfolded.

The rotary plate may include a first rotary plate hinged to the first plate and the second plate and a second rotary plate hinged to the first plate.

An insertion groove may be formed in the second plate and the slide plate may go into and come from the insertion groove.

Another aspect is a foldable display, comprising a flexible display panel having first and second ends opposing each other; a first plate connected to the first end of the flexible display panel; a second plate facing the first plate; a third plate configured to slide in and out of the second plate, wherein the third plate is connected to the second end of the flexible display panel; and a first rotary plate hinged to at least one of the first and second plates.

When the foldable display is folded, a portion of the flexible display panel can be enclosed by a space defined between the first and second plates and the remaining portion of the flexible display panel can be located on a side of the second plate opposing the space. When the foldable display is folded, the flexible display panel can have a substantially S-shape or a substantially reverse S-shape. When the foldable display is unfolded, the third plate can extend from the second plate and the first rotary plate can be substantially parallel to the first and second plates. The portion of the flexible display panel can be configured to be removed from the space when the foldable display is unfolded. The foldable display can further comprise a second rotary plate, wherein the first rotary plate is hinged to the first plate and the second plate and wherein the second rotary plate is hinged to the first plate. A groove can be formed in the second plate and wherein the third plate is configured to slide in and out of the second plate via the groove. The first and second hinge plates can be configured to be substantially parallel to each other while the foldable display is folded and unfolded. The foldable display can have first and second ends opposing each other, wherein the first end of the flexible display panel is connected to the first plate at the first end of the foldable display, and wherein the second end of the flexible display panel is connected to the third plate at the second end of the foldable display. A slot can be formed in the first rotary plate and wherein the flexible display panel is configured to slide through the slot.

Another aspect is a foldable display, comprising first and second plate opposing each other, wherein a groove is formed in the second plate along the length thereof, a third plate configured to be inserted into the second plate via the groove, and a flexible display panel having first and second ends opposing each other, wherein the first end of the flexible display panel is connected to the first plate and the second end of the flexible display panel is connected to the third plate and wherein the flexible display panel is configured to be i) unfolded when the third plate extends from the second plate and ii) folded when the third plate is inserted into the second plate.

The foldable display can further comprise first and second rotary plates formed at opposing ends of each of the first and second plates, wherein the first rotary plate is hinged to the first and second plates and wherein the second rotary plate is hinged to the first plate. A space can be defined by the first and second plates and the first and second rotary plates and wherein, when the flexible display panel is folded, a portion of the flexible display panel is enclosed by the space and the remaining portion of the flexible display panel is located on a side of the second plate opposing the space. The portion of the flexible display panel can be configured to be removed from the space when the foldable display is unfolded. When the foldable display is unfolded, the third plate can extend from the second plate and the first and second rotary plates can be substantially parallel to the first and second plates. The flexible display panel can have a substantially S-shape or a substantially reverse S-shape when folded. The first and second hinge plates can be configured to be substantially parallel to each other while the flexible display panel is folded and unfolded. A slot can be formed in the first rotary plate and the flexible display panel can be configured to slide through the slot.

Another aspect is a foldable display, comprising a flexible display panel having first and second ends opposing each other, a first plate connected to the first end of the flexible display panel, a second plate facing the first plate, and a third plate configured to slide in and out of the second plate, wherein the third plate is connected to the second end of the flexible display panel.

The foldable display can further comprise first and second rotary plates formed at opposing ends of each of the first and second plates, wherein the first rotary plate is hinged to the first and second plates and wherein the second rotary plate is hinged to the first plate.

DETAILED DESCRIPTION OF CERTAIN INVENTIVE EMBODIMENTS

Figure 1:
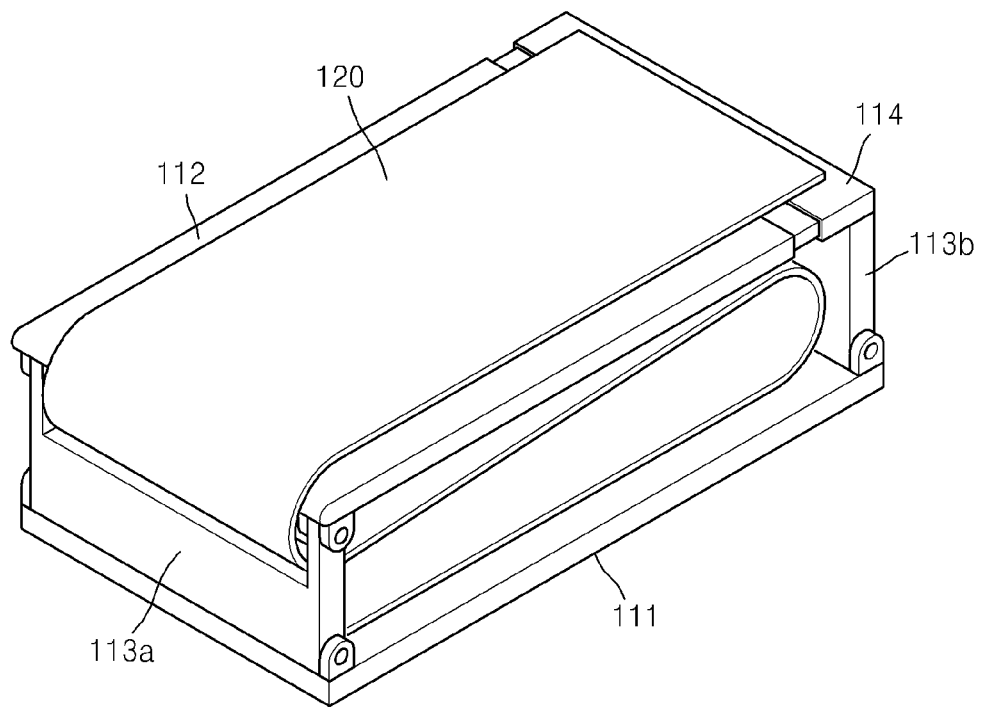
FIG. 1 is a perspective view of a foldable display according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the present description.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may also be present.

The sizes of elements in the drawings may be exaggerated for convenience of explanation. In other words, since the sizes and thicknesses of components in the drawings may be exaggerated, the following embodiments are not limited thereto.

When a certain embodiment may be implemented differently, the specific process order may be performed differently from the described order. For example, two consecutively described processes may be performed substantially at the same time or performed in an order opposite to the described order.

The term "substantially" as used in this disclosure can include the meanings of completely, almost completely, or to any significant degree in some applications and in accordance with the understanding of those skilled in the art.

FIG. 1 is a perspective view of a foldable display according to an embodiment.

The foldable display includes a flexible display panel 120 that can be bent. The flexible display panel 120 can include a thin film transistor and an emission device for forming an image. The flexible display panel 120 can also include an encapsulation layer covering and protecting the film transistor and the emission device which can be stacked on a flexible substrate. The display panel 120 includes the flexible substrate instead of a hard glass substrate, and thus the flexible display panel 120 can be freely folded and unfolded within an acceptable flexibility range thereof. Accordingly, the flexible display panel 120 can be folded in an S-shaped as shown in FIG. 1.

When bent, the flexible display panel 120 is enclosed by a seating space defined by first and second plates 111 and 112 that face each other and first and second rotary plates 113a and 113b that are connected to side surfaces of the first and second plates 111 and 112.

Figure 2A:
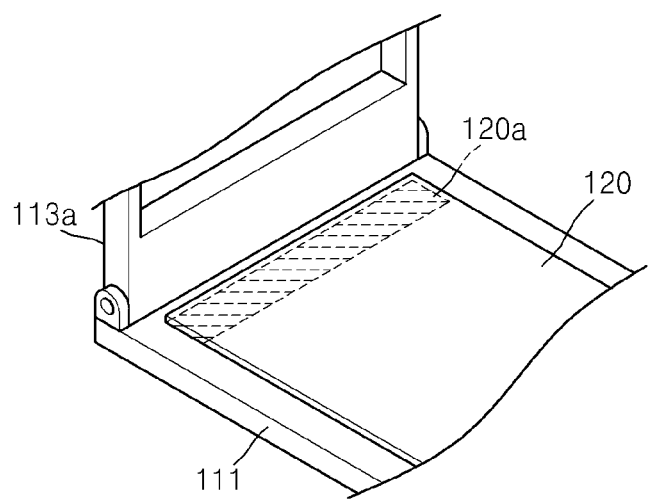
FIGS. 2A and 2B are schematic views of the coupling structures of one end portion and another end portion of the foldable display of FIG. 1.
Figure 2B:
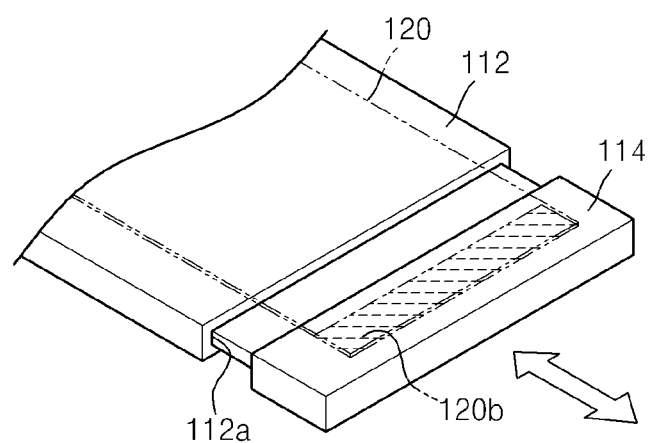

That is, one end portion or a first end portion 120a of the flexible display panel 120 is connected to the first plate 111 as shown in FIG. 2A and another end portion or second end portion 120b thereof is connected to a slide plate or third plate 114. The slide plate 114 is slidably inserted into an insertion groove or groove 112a formed in the second plate 112 as shown in FIG. 2B. A portion of the flexible display panel 120 between the one end portion 120a and the other end portion 120b is enclosed in the seating space when the flexible display panel 120 is bent. More specifically, the one end portion 120a of the flexible display panel 120 is connected to the first plate 111 in the seating space and the other end portion 120b thereof is placed over the second plate 112.

The slide plate 114 is moveable in and out of the insertion groove 112a of the second plate 112. When the flexible display panel 120 is unfolded, the slide plate 114 is pulled out of the insertion groove 112a to a distance from the second plate 112.

The first rotary plate 113a is hinged to each of the first and second plates 111 and 112. The second rotary plate 113b is hinged to the first plate 111. When the flexible display panel 120 is folded, the first and second rotary plates 113a and 113b maintain a space between the first and second plates 111 and 112 to define the seating space. When the flexible display panel 120 is unfolded, the first and second rotary plates 113a and 113b rotate to a direction substantially parallel to the first and second plates 111 and 112 such that the flexible display panel 120 is unfolded to be flat.

According to other embodiments, the second rotary plate 113b is also hinged to the second plate 112. Thus, the slide plate 114 and insertion groove 112a can be formed closer to the peripheral of the foldable display than the hinge between the second rotary plate 113b and the second plate 112. Alternatively, the slide plate 114 can be formed narrower than the second plate 112 and the second plate can be formed to surround three sides of the slide plate 114. In these embodiments, the second plate 112 is hinged to the second rotary plate at the portions of the second plate surrounding the slide plate 114.

Figure 4:
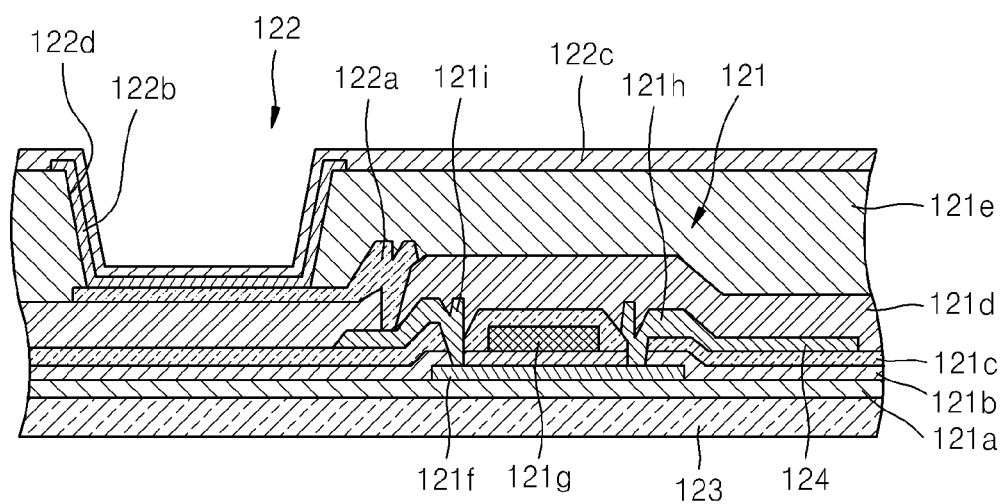
FIG. 4 is a cross-sectional view of the detailed structure of a flexible display panel of the foldable display of FIG. 1.

The folding and unfolding operations will be described in greater detail later. The inner structure of the flexible display panel 120 will now be briefly described. Referring to FIG. 4, the flexible display panel 120 includes a thin film transistor 121 and an electroluminescent (EL) device 122. In some embodiments, the EL device is an organic light-emitting diode (OLED) display. An emission layer 122b that is vulnerable to contact of, in particular, gas is included in the EL device 122. In more detail, a semiconductor active layer 121f is formed on a buffer layer 121a adjacent to a flexible substrate 123. The semiconductor active layer 121f includes source and drain regions doped with high concentrations of N-type or P-type impurities. The semiconductor active layer 121f may be formed of an oxide semiconductor. For example, the oxide semiconductor may include an oxide formed of a material selected from the group of 12, 13, and 14 Group metal elements such as zinc (Zn), indium (In), gallium (Ga), tin (Sn), cadmium (Cd), germanium (Ge), hafnium (Hf), and combinations thereof. For example, the semiconductor active layer 121f may include I-G-Z-O [$(In_2O_3)a(Ga_2O_3)b(ZnO)c$] (where a, b, and c are real numbers that satisfy conditions of a≥0, b≥0, and c>0). A gate insulating layer 121b is formed on the semiconductor active layer 121f to electrically insulate the semiconductor active layer 121f from a gate electrode 121g. An interlayer insulating layer 121c is interposed between the gate electrode 121g and a source electrode 121h and a drain electrode 121i. A passivation layer 121d is interposed between the source electrode 121h and the drain electrode 121i and an anode electrode 122a which is electrically connected to the EL device 122.

An insulating planarization layer 121e can be formed of acryl and is formed on the anode electrode 122a. A predetermined opening 122d is formed in the insulating planarization layer 121e and then the EL device 122 is formed therein.

In some embodiments, the EL device 122 emits one of red, green, and blue light based on the flow of current therethrough to display predetermined image information. The EL device 122 includes the anode electrode 122a that is connected to the drain electrode 121i of the thin film transistor 121 and receives a driving current from the drain electrode 121i. The EL device 122 also includes a cathode electrode 122c that covers all of the pixels of the flexible display panel 120 and supplies a common voltage to the EL device 122. The emission layer 122b is interposed between the anode electrode 122a and the cathode electrode 122c and emits light.

In some embodiments, a hole injection layer (HIL), a hole convey layer (HTL), an electron convey layer (ETL), and an electron injection layer (EIL) are stacked adjacent to the emission layer 122b.

The emission layer 122b may be separately formed in each pixel such that pixels that emit red, green, and blue light are grouped together to form a single unit pixel. Alternatively, the emission layer 122b may be commonly formed over the entire display region of the flexible display panel 120 irrespective of the positions of pixels. In these embodiments, the emission layer 122b is formed by vertically stacking or mixing layers including emission materials that emit, for example, red, green, and blue light. Combinations of other colors are also possible such that these combinations result in the emission of while light. A color conversion layer or color filter that converts the emitted white light into different colors may be further included.

A thin film encapsulation layer (not shown) in which organic layers and inorganic layers are alternately stacked can be formed on the cathode electrode 122c.

The flexible display panel 120 having the above-described structure can be bent, and thus, the flexible display panel 120 can be bent into an S-shape in a seating space defined by the first and second plates 111 and 112, the first and second rotary plates 113a and 113b, and the slide plate 114.

The foldable display as described above can be used as shown in FIGS. 3A through 3E.

Figure 3A:
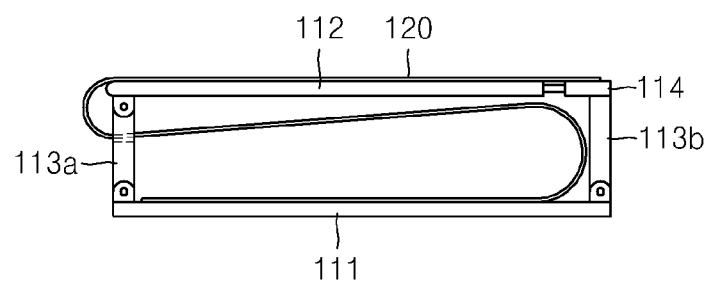
FIGS. 3A through 3E are diagrams for explaining a process of folding the foldable display of FIG. 1.

When the foldable display is folded, as shown in FIG. 3A, the flexible display panel 120 is folded in an S-shape. That is, as described above, the flexible display panel 120 is folded to form an S-shape in the seating space defined by the first and second plates 111 and 112, the first and second rotary plates 113a and 113b, and the slide plate 114 so that a user may carry the foldable display.

As described above, the foldable display has a plurality of plates surrounding the seating space of the flexible display panel 120 and has no plate member in the seating space. Accordingly, it is very advantageous to slimming the profile of the foldable display. That is, if a flexible display panel is formed of various plate members which overlap to form steps and is then folded, the thicknesses of the multiple plate members are added together, increasing the thickness of the flexible display panel. However, the flexible display panel 120 according to at least one embodiment is freely bent in the seating space between the first and second plates 111 and 112 without an additional plate member, and thus the foldable display can be formed with a thin profile.

Figure 3B:
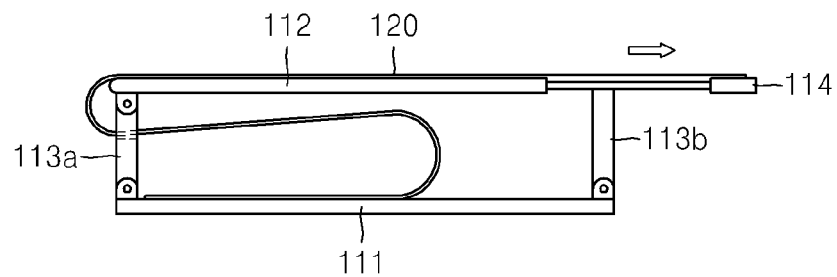
Figure 3C:
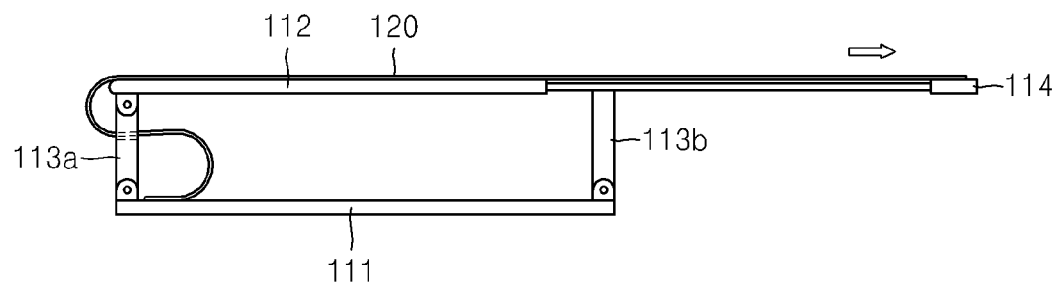

When the flexible display panel 120 is unfolded to be used, as shown in FIG. 3B, the slide plate 114 is removed from the insertion groove 112a of the second plate 112. Then, the other end portion 120b of the flexible display panel 120 moves with the slide plate 114 so that the body of the flexible display panel 120 is removed from the seating space around the second plate 112 as shown in FIG. 3C. A slot can be formed in the first rotary plate 113a and the flexible display panel 120 slides through then slot when removed from the seating space.

Figure 3D:
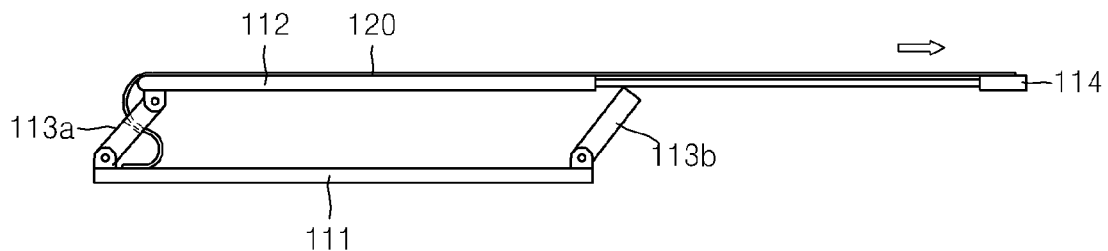

After nearly the entire flexible display panel 120 is above the second plate 112, the first and second rotary plates 113a and 113b are folded down as shown in FIG. 3D.

Figure 3E:
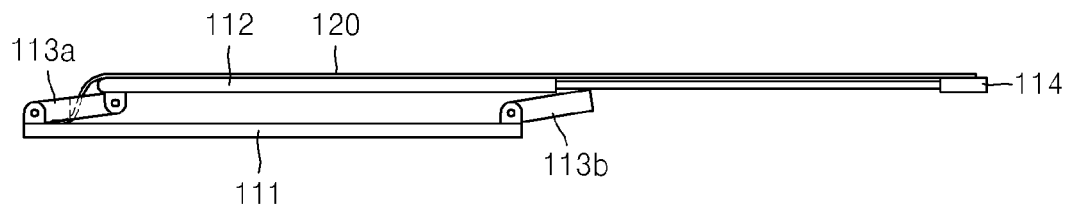

Then, as shown in FIG. 3E, the first and second plates 111 and 112, the first and second rotary plates 113a and 113b, and the slide plate 114 are laid substantially horizontally and the flexible display panel 120 is unfolded to be substantially flat.

After being unfolded, when the foldable display is operated, the user can view a screen on the flexible display panel 120 that is substantially flat.

Thereafter, the foldable display can be folded by standing the first and second rotary plates 113a and 113b up and inserting the slide plate 114 into the insertion groove 112a in the reverse order to the above described order.

Therefore, folding and unfolding operations can be easily and smoothly implemented by removing the slide plate 114 from the insertion groove 112a and rotating the first and second rotary plates 113a and 113b.

As described above, according to at least one embodiment, the foldable display has thin profile when folded, which is advantageous to slimming the foldable display, thereby greatly improving the mobility of the display.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the inventive technology have been described with reference to the figures, it will be understood by those of ordinary skill in the art that various changes in form and details may be made therein without departing from the spirit and scope of the present invention as defined by the following claims.

What is claimed is:
1. A foldable display, comprising:
a flexible display panel having first and second ends opposing each other;
a first plate connected to the first end of the flexible display panel;
a second plate facing the first plate;
a third plate configured to slide in and out of the second plate, wherein the third plate is connected to the second end of the flexible display panel; and
a first rotary plate hinged to at least one of the first and second plates, wherein a slot is formed in the first rotary plate and wherein the flexible display panel s configured to slide through the slot.

2. The foldable display of claim 1, wherein, when the foldable display is folded, i) a portion of the flexible display panel is enclosed by a space defined between the first and second plates and ii) the remaining portion of the flexible display panel is located on a side of the second plate opposing the space.

3. The foldable display of claim 2, wherein, when the foldable display is folded, the flexible display panel has a substantially S-shape or a substantially reverse S-shape.

4. The foldable display of claim 2, wherein, when the foldable display is unfolded, i) the third plate extends from the second plate and ii) the first rotary plate is substantially parallel to the first and second plates.

5. The foldable display of claim 4, wherein the portion of the flexible display panel is configured to be removed from the space when the foldable display is unfolded.

6. The foldable display of claim 1, further comprising a second rotary plate, wherein the first rotary plate is hinged to the first plate and the second plate and wherein the second rotary plate is hinged to the first plate.

7. The foldable display of claim 6, wherein a groove is formed in the second plate and wherein the third plate is configured to slide in and out of the second plate via the groove.

8. The foldable display of claim 6, wherein the first and second hinge plates are configured to be substantially parallel to each other while the foldable display is folded and unfolded.

9. A foldable display, comprising:
first and second plate opposing each other, wherein a groove is formed in the second plate along the length thereof;
a third plate configured to be inserted into the second plate via the groove; and
a flexible display panel having first and second ends opposing each other,
wherein the first end of the flexible display panel is connected to the first plate and the second end of the flexible display panel is connected to the third plate, and
wherein the flexible display panel is configured to be i) unfolded when the third plate extends from the second plate and ii) folded when the third plate is inserted into the second plate;
first and second rotary plates formed at opposing ends of each of the first and second plates, wherein the first rotary plate is hinged to the first and second plates and wherein the second rotary plate is hinged to the first plate,
wherein a space is defined by the first and second plates and the first and second rotary plates and wherein, when the flexible display panel is folded, i) a portion of the flexible display panel is enclosed by the space and ii) the remaining portion of the flexible display panel is located on a side of the second plate opposing the space.

10. The foldable display of claim 9, wherein the portion of the flexible display panel is configured to be removed from the space when the foldable display is unfolded.

11. The foldable display of claim 9, wherein, when the foldable display is unfolded, i) the third plate extends from the second plate and ii) the first and second rotary plates are substantially parallel to the first and second plates.

12. The foldable display of claim 9, wherein, the flexible display panel has a substantially S-shape or a substantially reverse S-shape when folded.

13. The foldable display of claim 9, wherein the first and second hinge plates are configured to be substantially parallel to each other while the flexible display panel is folded and unfolded.

14. The foldable display of claim 9, wherein a slot is formed in the first rotary plate and wherein the flexible display panel is configured to slide through the slot.

15. A foldable display for transitioning between a folded position and an unfolded position, the foldable display comprising:
a first plate;
a second plate facing the first plate, the second plate being spaced apart from the first plate in the folded position such that a space is defined between the first and second plates;
a third plate configured to slide in and out of the second plate;
a flexible display panel connected to the third plate,
wherein, in the folded position, a first portion of the flexible display panel extends over a surface of the second plate opposite to the space, and a second portion of the flexible display panel is disposed within the space defined between the first and second plates,
wherein, the flexible display panel is connected to the third plate such that when the third plate is slid out of the second plate i) the flexible display panel moves along the surface of the second plate opposite to the space, and ii) the flexible display panel is removed from the space defined between the first and second plates.

16. The foldable display of claim 15, further comprising:
a first rotary plate hinged to a first end of the first plate and a first end of the second plate, and
a second rotary plate is hinged to at least a second end of the first plate that is opposite to the first end of the first plate,
wherein the first rotary plate, the second rotary plate, the first plate and the second plate form a collapsible structure in which the first and second rotary plates are rotatable in the same direction to decrease the distance between first plate and the second plate.

17. The foldable display of claim 15, wherein the first rotary plate comprises a slot, and the flexible display is connected to the third plate such that the flexible display slides through the slot when the third plate is slid in or out of the second plate.

18. The foldable display of claim 15, further comprising:
a first rotary plate hinged to a first end of the first plate and a first end of the second plate, and
a second rotary plate is hinged to at least a second end of the first plate that is opposite to the first end of the first plate,
wherein the first rotary plate, the second rotary plate, the first plate and the second plate define the space in which the second portion of the flexible display is disposed.

19. The foldable display of claim 18, wherein the first rotary plate comprises a slot, and the flexible display is connected to the third plate such that the flexible display slides through the slot when the third plate is slid in or out of the second plate.

20. The foldable display of claim 15, wherein a first end of the flexible display panel is connected to a surface of the first plate facing the second plate, and a second end of the flexible display panel is connected to the third plate.

21. A foldable display, comprising:
- a flexible display panel;
- the flexible display panel having a first area and a second area;
- a first plate;
- a second plate having a first surface and a second surface;
- the first surface facing the first plate;
- the second surface facing away from the first plate;
- the first area substantially covering the entire second surface;
- the second plate comprising a moving plate and a fixed plate;
- wherein as the moving plate slides along the fixed plate and extends, the size of the second surface becomes increased and the size of the first area is also increased so that the first area continues to substantially cover the entire second surface,
- wherein the second area is stored within a space defined between the first and second plates, and the size of the second area is decreased as the moving plate slides along the fixed plate and extends, and
- the first and second plate are collapsible to decrease the space defined between the first and second plates when the size of the second area is decreased.

* * * * *